United States Patent
Shiota et al.

(10) Patent No.: US 8,103,899 B2
(45) Date of Patent: *Jan. 24, 2012

(54) NONVOLATILE MEMORY SYSTEM

(75) Inventors: Shigemasa Shiota, Tachikawa (JP);
Hiroyuki Goto, Higashimurayama (JP);
Hirofumi Shibuya, Matsuda (JP);
Fumio Hara, Higashikurume (JP); Kinji Mitani, Higashimurayama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 218 days.

This patent is subject to a terminal disclaimer.

(21) Appl. No.: 12/245,203

(22) Filed: Oct. 3, 2008

(65) Prior Publication Data

US 2009/0037767 A1 Feb. 5, 2009

Related U.S. Application Data

(63) Continuation of application No. 11/583,156, filed on Oct. 19, 2006, now Pat. No. 7,447,936, which is a continuation of application No. 10/756,292, filed on Jan. 14, 2004, now Pat. No. 7,137,027.

(30) Foreign Application Priority Data

Feb. 7, 2003 (JP) ................................ 2003-030292

(51) Int. Cl.
*G06F 11/00* (2006.01)
(52) U.S. Cl. .......................................................... 714/5
(58) Field of Classification Search ....................... 714/5
See application file for complete search history.

(56) References Cited

U.S. PATENT DOCUMENTS

| 5,434,825 | A | * | 7/1995 | Harari | 365/185.24 |
|---|---|---|---|---|---|
| 5,583,812 | A | * | 12/1996 | Harari | 365/185.33 |
| 5,633,824 | A | | 5/1997 | Onuki | |
| 5,673,383 | A | * | 9/1997 | Sukegawa | 714/8 |
| 6,000,005 | A | * | 12/1999 | Yamada | 711/103 |
| 6,000,006 | A | * | 12/1999 | Bruce et al. | 711/103 |
| 6,044,014 | A | * | 3/2000 | Komori et al. | 365/185.04 |
| 6,108,235 | A | * | 8/2000 | Honma | 365/185.04 |
| 6,108,236 | A | * | 8/2000 | Barnett | 365/185.09 |
| 6,339,546 | B1 | * | 1/2002 | Katayama et al. | 365/185.09 |
| 6,347,051 | B2 | * | 2/2002 | Yamagami et al. | 365/185.09 |
| 6,373,747 | B1 | * | 4/2002 | Harari et al. | 365/185.09 |
| 6,480,416 | B2 | * | 11/2002 | Katayama et al. | 365/185.09 |
| 6,788,609 | B2 | * | 9/2004 | Yamagami et al. | 365/230.01 |
| 6,914,845 | B2 | * | 7/2005 | Ooishi | 365/229 |
| 6,914,846 | B2 | * | 7/2005 | Harari et al. | 365/230.03 |

(Continued)

FOREIGN PATENT DOCUMENTS

JP 08-096589 4/1996

(Continued)

*Primary Examiner* — Robert Beausoliel
*Assistant Examiner* — Amine Riad
(74) *Attorney, Agent, or Firm* — Miles and Stockbridge, P.C.

(57) ABSTRACT

A memory system permitting a number of alternative memory blocks to be made ready in order to extend the rewritable life and thereby contributing to enhanced reliability of information storage is to be provided. The memory system is provided with a nonvolatile memory having a plurality of data blocks in predetermined physical address units and a controller for controlling the nonvolatile memory in response to an access request from outside. Each of the data blocks has areas for holding a rewrite count and error check information regarding each data area. The controller, in a read operation on the nonvolatile memory, checks for any error in the area subject to the read according to error check information and, when there is any error, if the rewrite count is greater than a predetermined value, will replace the pertinent data block with another data block or if it is not greater, correct data in the data block pertaining to the error.

6 Claims, 14 Drawing Sheets

U.S. PATENT DOCUMENTS

| | | |
|---|---|---|
| 6,941,505 B2 | 9/2005 | Yada et al. |
| 7,006,386 B2 * | 2/2006 | Yamagami et al. ...... 365/185.33 |
| 2001/0030890 A1 * | 10/2001 | Yamagami et al. ...... 365/185.09 |
| 2002/0080650 A1 | 6/2002 | Katayama et al. |
| 2003/0090941 A1 * | 5/2003 | Harari et al. ............. 365/185.29 |
| 2003/0126391 A1 * | 7/2003 | Neufeld et al. ............... 711/165 |

FOREIGN PATENT DOCUMENTS

| | | |
|---|---|---|
| JP | 2001-229069 | 8/2001 |
| JP | 2002-008381 A | 1/2002 |
| KR | 2002-21001 A | 3/2002 |
| WO | WO 01/22232 | 3/2001 |

* cited by examiner (LOGICAL ADDRESS DATA REWRITE/READ FLOW ACCORDING TO THE INVENTION)

NONVOLATILE MEMORY SYSTEM

CROSS-REFERENCE TO RELATED APPLICATION

This application is a continuation of application Ser. No. 11/583,156 filed Oct. 19, 2006, now U.S. Pat. No. 7,447,936 which is a continuation of application Ser. No. 10/756,292 filed Jan. 14, 2004 (now U.S. Pat. No. 7,137,027).

BACKGROUND OF THE INVENTION

The present invention relates to a nonvolatile memory system, and more particularly to a technique that can be effectively applied to, for instance, a flash memory card and a flash disk compatible with a hard disk.

Rewriting of stored information in an electrically rewritable nonvolatile memory, typically a flash memory, gives rise to electrical stresses in memory cells, and the characteristics of the memory cells deteriorate with an increase in the count of rewrites. It is therefore a usual practice to predetermine the number of rewrites up to which the performance of the nonvolatile memory can be guaranteed. Rewrites may concentrate on some of the data blocks, and there are provided techniques by which any data block which has reached the permissible limit of rewrites is replaced with an unused memory block in an alternative area (see Patent References 1 and 2).

There also is available a technique by which the number of corrections by EEC in each data block is counted, and any data block whose correction count has reached a certain number is replaced with an unused memory block in an alternative area (see Patent Reference 3).

Furthermore, since any data block on which writes have concentrated would significantly deteriorate in performance, there also is a technique by which, when data and address rewrites have reached a certain count, the pertinent area is automatically replaced with an area where the number of rewrites is smaller, and the rewritable life of the nonvolatile memory is thereby extended. For instance, if the number of rewrites surpasses a predetermined level, address allocation in the data block will be altered (see Patent Reference 4). Or if the number of ECC errors surpasses a predetermined level, address allocation in the data block will be altered (see Patent Reference 5).

Patent Reference 1: Japanese Unexamined Patent Publication No. Hei 08 (1996)-96589
Patent Reference 2: Japanese Unexamined Patent Publication No. 2001-229069
Patent Reference 3: WO 01/22232
Patent Reference 4: U.S. Pat. No. 5,434,825
Patent Reference 5: U.S. Pat. No. 5,583,812

SUMMARY OF THE INVENTION

The present inventors studied the processing of data block replacement in a nonvolatile memory, such as a flash memory. In particular, the inventors studied a large capacity storage compatible with a hard disk, such as a large capacity and high speed flash memory card or a flash disk to which a nonvolatile memory, such as a flash memory, was applied.

A first aspect of the study was making appropriate the processing of data block replacement in a nonvolatile memory. Even if a data block is rewritten beyond the guaranteed count, the memory cell will not necessarily deteriorate in performance. Therefore, if data blocks are replaced merely on the basis of the rewrite count as Patent References 1 and 2 require, still usable data blocks may be wastefully replaced. In other words, the rewrite count which signals the replacement timing differs from one data block to another on account of process fluctuations.

A second aspect was the reliability of information storage. Even if a data block is to be replaced as soon as the number of corrections by ECC has reached a predetermined level as set forth in Patent Reference 3, a flash memory whose guaranteed rewrite count is 300,000 times, for instance, will remain rewritable until the 500,000th rewrite or even later if its first ECC correction occurs then. In other words, a data block deteriorated in performance may remain rewritable, and this could reduce the reliability of information storage. For instance, if performance deterioration invites frequent errors correctable by an ECC circuit and in addition illegal data occur as a result of disturbance or for any other reason, the number of bits correctable by the ECC circuit may be exceeded, and then errors could no longer be coped with by the ECC circuit, making it impossible to protect stored data.

If the erroneous data are voice or image data, that partial data error would little affect other processing. However, if they are arithmetic processing data or included in a program, even a partial data error could considerably affect other processing, sometimes fatally, depending on the nature of data processing. Therefore, a flash memory card or a flash disk compatible with a hard disk requires a high level of reliability in information storage.

A third aspect was high speed access processing. In a case in which arithmetic processing data or data in a program are to be stored in a flash memory card or a flash disk compatible with a hard disk, increasing the speed of data processing would require a high speed access processing capability on the part of the flash memory card or the like. If table referencing in connection with access processing is required every time to extend the rewritable life, that referencing would constitute a heavy overhead because of the large capacity. For instance according to techniques disclosed in Patent References 4 and 5, a matching table indicating the allocation of addresses in a data block should be read in at the time of every access.

An object of the present invention is to provide a memory system capable of restraining wasteful replacement of usable data blocks in order to extend the rewritable life. In other words, a memory system is capable of reducing the number of alternative memory blocks required for extending the rewritable life.

Another object of the invention is to provide a memory system capable of restraining the continued presence in a rewritable state of data blocks deteriorated in performance and thereby enhancing the reliability of information storage.

Still another object of the invention is to provide a memory system capable of eliminating the need to reference a table in connection with access processing every time in order to extend the rewritable life and of extending the rewritable life while warranting high speed access.

The above-described and other objects and novel features of the present invention will become more apparent from the following description in this specification when taken in conjunction with the accompanying drawings.

Typical aspects of the invention disclosed in this application will be briefly described below.

(1) A first aspect of the invention concerns replacement control in a read operation. A memory system in this aspect of the invention is provided with a nonvolatile memory having a plurality of data blocks in predetermined physical address units and a controller for controlling the nonvolatile memory in response to an access request from outside. Each of the data blocks has areas (31 and 32) for holding a rewrite count and error check information regarding each data area. The controller, in a read operation on the nonvolatile memory, checks for any error in the area subject to the read according to error check information and, when there is any error, if the rewrite count is greater than a predetermined value, will replace the pertinent data block with another data block or if it is not greater, correct data in the data block pertaining to the error.

A nonvolatile memory with a good history is still capable of rewriting even if the predetermined rewrite count limit has been reached. As indicators of that capability, the count of data errors that have occurred in the data block and the rewrite count at the time are taken into consideration. If there is any error in the data read out of the data block and the rewrite count has not reached the predetermined limit, correction by ECC or otherwise will be performed. Usually in a nonvolatile memory, such as a flash memory, within the guaranteed rewrite count threshold, if it has an error correcting capability (the number of error-correctable bits) recommended or required by the manufacturer of the memory, no uncorrectable situation will occur. Therefore, no problem in the reliability of data is likely to occur even if data whose error has been corrected by ECC or otherwise are returned to the pertinent data block. On the other hand, if there is any data error and the rewrite count has reached the predetermined limit, an error of a bit number beyond the error correcting capability of ECC is likely to occur. Therefore the data block will be replaced and the new replacing data block will be caused to hold the corrected data for subsequent use.

Therefore, according to the replacement technique described above, even if the rewrite count has surpassed the guaranteed limit, the combination with ECC will still make possible replacement, and the average rewrite count per data block address can be increased, compared with the technique by which replacement is performed merely on the basis of a predetermined rewrite count limit. As this makes it possible to dispense with an excessive alternative area and to restrain the process overhead involved in replacement, high speed access can be ensured.

Furthermore, a much deteriorated data block can be prevented from being left in a rewritable state unlike in the case wherein the number of errors according to ECC is made the sole yardstick of data block replacement, resulting in enhanced reliability of information storage.

In a concrete mode of the invention, the data block has an address information holding area (30) capable of using information on a logical address to correspond to its physical address. Then the controller selects the data block according to the logical address as the physical address, and will judge that the selected data block has not been replaced if the physical address of that data block is found identical with information held in the address information holding area of that data block. Therefore, only when the physical address of the selected data block and the information held in the address information holding area of that data block is found not identical, the table for checking replaced addresses or the like needs to be referenced. Thus, the table need not be referenced on every occasion of access processing, and accordingly the rewritable life can be extended while ensuring high speed access.

As the table for checking replaced addresses, the nonvolatile memory may have, for instance a table of replaced addresses. The table of replaced addresses has table information holding areas (40) to be used for holding, in conformity with the sequence of arrayed physical addresses, the corresponding items of logical address information. The controller, when it has found non-identity between the physical address of the data block selected according to the logical address as the physical address and information held in the address information holding area of that data block, can reference the table information holding area corresponding to the physical address of the table of replaced addresses and find out which data block the logical address is replaced by.

To determine a new available alternative, an unused code (USFLG) is stored into the table information holding area corresponding to a data block to which no logical address is allocated. The controller, when replacing a data block, references the table of replaced addresses, and determines a data block corresponding to the unused code as a new available alternative.

Regarding the address information holding area, the controller initializes the address information holding area of any data block to which no logical address is allocated with an invalid code other than a logical address. Further the controller, when replacing any data block, causes the address information holding area of the replacing data block to hold the physical address of the data block to be replaced. The controller also places the data block, which has suffered a rewrite failure, in an erase state. This is intended to unify the treatment of the address information holding areas of replaced data blocks and to enable the replacement history to be referenced from data block information in time of trouble or the like.

In another concrete mode of the present invention, each of specific data blocks out of a plurality of data blocks has a storage area for rewrite threshold count data (TDAT). The controller judges a rewrite count identical with the rewrite threshold count data to be the predetermined rewrite count. Since the rewritable life of a data block fluctuates from one semiconductor manufacturing process to another, this arrangement is made to enable the rewritable life to be extended accordingly.

The nonvolatile memory may be a flash memory for instance. The logical address information consists of 32 bits or more. The storage capacity of the flash memory can be expanded to the order of gigabits or even more. As the error check information, an ECC code, a CRC code, a parity code or a SUM value code may be used.

The controller may be configured, for instance, of an external interface circuit, a buffer, a CPU, an ECC circuit and a memory interface circuit.

(2) A second aspect of the invention concerns replacement control in a rewrite operation. In a memory system in this aspect, in a rewrite operation on the nonvolatile memory, when the controller fails in rewriting on the data block subject to the rewrite, if the rewrite count is greater than a predetermined value, the controller will replace the data block with another data block or, if it is not greater, rewrite again on the data block pertaining to the failure. If the attempt to rewrite again fails, the data block will be replaced with still another data block.

A third aspect of the invention concerns another way of replacement control in a rewrite operation. The memory system in this aspect is provided with a nonvolatile memory having a plurality of data blocks in predetermined physical address units and a controller for controlling the nonvolatile memory in response to an access request from outside, wherein each of the data blocks has areas (31 and 33) for holding a rewrite count and an error correction flag. The controller, in a rewrite operation on the nonvolatile memory, will perform rewrite processing on a data block subject to the rewrite if the rewrite count of the data block is not greater than a predetermined value, will replace the data block with another data block if the rewrite count is greater than the predetermined value and the error correction flag indicates that the data block has undergone error correction, or will process rewrite on the data block if it indicates that the data block has undergone no error correction. In rewrite processing on the nonvolatile memory, when the controller fails in rewriting on the data block subject to the rewrite, it may replace the data block with another data block if the rewrite count is greater than the predetermined value, or rewrite again on the data block pertaining to the failure if the rewrite count is not greater. The error correction flag is flag information of one bit or more indicating whether or not error correction has been done.

As a concrete mode of the invention in its second and third aspects, the same means as in the first aspect described above may be used.

According to the invention in its second and third aspects, like the invention in its first aspect, the combination with ECC, even if the rewrite count surpasses the limit of guarantee, will make replacement still possible, and make an excessive alternative area dispensable. Furthermore, a much deteriorated data block can be prevented from being left in a rewritable state unlike in the case wherein the number of errors according to ECC is made the sole yardstick of data block replacement, resulting in enhanced reliability of information storage. As the controller selects a data block according to its logical address as the physical address, the table need not be referenced on every occasion of access processing, making it possible to extend the rewritable life while ensuring high speed access.

DETAILED DESCRIPTION OF THE PREFERRED EMBODIMENT

Figure 1:
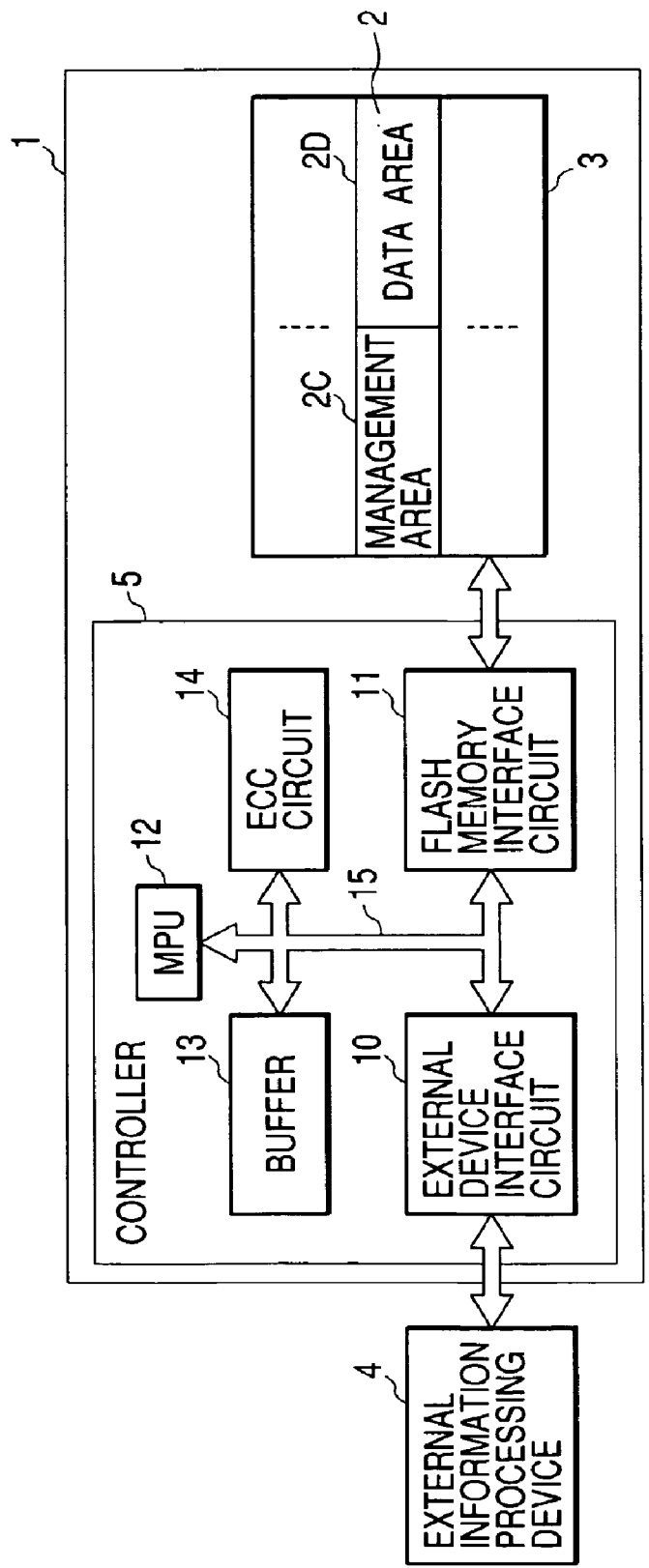
FIG. 1 is a block diagram of a flash memory card, which is an example of memory system according to the present invention.

[Flash memory card] FIG. 1 illustrates a flash memory card, which is an example of memory system according to the present invention. The flash memory card 1 illustrated therein is provided with a nonvolatile memory, for instance a flash memory 3, having in a predetermined casing a plurality of data blocks 2 of which each matches a predetermined physical address, and a controller 5 which controls the flash memory 3 in response to an access request from an external information processing device 4. The predetermined casing is a casing of, for instance, a PC card or an 1.8 inch hard disk. The external information processing device 4 is a host device such as a personal computer, a personal digital assistant (PDA), or a digital camera. Each data block 2 is basically divided into a data area 2D and management area 2C.

The flash memory 3 has, though not shown, a memory cell array in which electrically erasable and writable flash memory cells are arranged in a matrix. The plurality of data blocks are configured in this memory cell array. Each of the data blocks, having a fixed storage capacity, for instance 1024 bits, consists of a plurality of flash memory cells.

For each flash memory cell can be adopted a floating gate structure in which electric charges can be injected into the floating gate as a conductor separated by an insulating film over the channel area or a charge trapping structure in which charges are locally injected into a charge trapping area, such as a silicon nitride film, though these are not the only available options. For instance, if the floating gate structure is used, the logical values of stored information are determined according to the difference in threshold voltage between a charged state and a discharged state. In the charge trapping structure, it is easy to store multi-value information according to the trapped position of the charge or the polarity of the trapped charge. Storing of data into such a flash memory cell is accomplished by, for instance, first processing to initialize the charge held by the memory cell (e.g. erasion or clearing) and second processing to alter the charged state from the initial state (e.g. programmed processing or writing). For example, the drain of a floating gate type flash memory cell is connected to a bit line, its source to a source line, and its control gate to a word line. Erasion is accomplished by applying a high voltage to the source line to extract electrons to the source line. Programming is accomplished by applying a high voltage to the word line to inject hot electrons from the drain to the floating gate. Erasion may be performed on a data block-by-data block basis, though this is not the absolute requirement.

The controller 5 has an external device interface circuit 10, a flash memory interface circuit 11, a microcomputer (MPU) 12, a buffer 13 consisting of a random access memory (RAM), an error correcting code (ECC) circuit 14, and an internal bus 15, though the configuration is not limited to this. The external device interface circuit 10 controls interfacing with the external information processing device 4. The specification of interfacing with an external device is, for instance, that of Integrated Device Electronics (IDE) with compatibility with the hard disk being taken into consideration. The flash memory interface circuit 11 controls flash memory interfacing in such a way as satisfies the command and data access requirements of the flash memory 3. The MPU 12 has a central processing unit (CPU), a work RAM for the CPU, and a control program ROM for the CPU. The CPU executes the control program to cause the external device interface circuit 10 to control external interfacing and the flash memory interface circuit 11 to control memory interfacing. The buffer 13 temporarily stores write data from the external information processing device 4 and read data to the external information processing device 4.

Although the controller and the memory are separated from each other in this embodiment of the invention, the two components and peripheral components can as well be integrated into a mixed semiconductor.

When the external device interface circuit 10 receives a data access request from the external information processing device 4, the MPU 12 gives a sector address, which is the physical address of the data to be accessed, an access command and so forth from the flash memory interface circuit 11 to the flash memory 3, and thereby controls data rewriting, data reading and other operations of the flash memory 3. The data rewriting is carried out by erasion and programmed processing. In the rewriting, write data supplied from the external information processing device 4 are provided to the flash memory 3. In the reading, data read out of the flash memory 3 are supplied to the external information processing device 4.

Each of the data blocks (which may as well be called sectors) 2 of the flash memory 3 is allocated a physical address (also referred to as a sector address), which represents the physical arrangement of the data block. In other words, the address allocation is incorporated into the decoding logic of an address decoder for decoding address signals and selecting a data block. The number of bits of the physical address is, for instance, 32. The logical arrangement of data blocks in the external information processing device 4 is managed according to a logical address. The MPU 12 utilizes a logical address designated by the external information processing device 4 as the physical address in accessing the flash memory 3. In short, the MPU 12 need not reference all the time the matching table of logical addresses and physical addresses.

Figure 2:
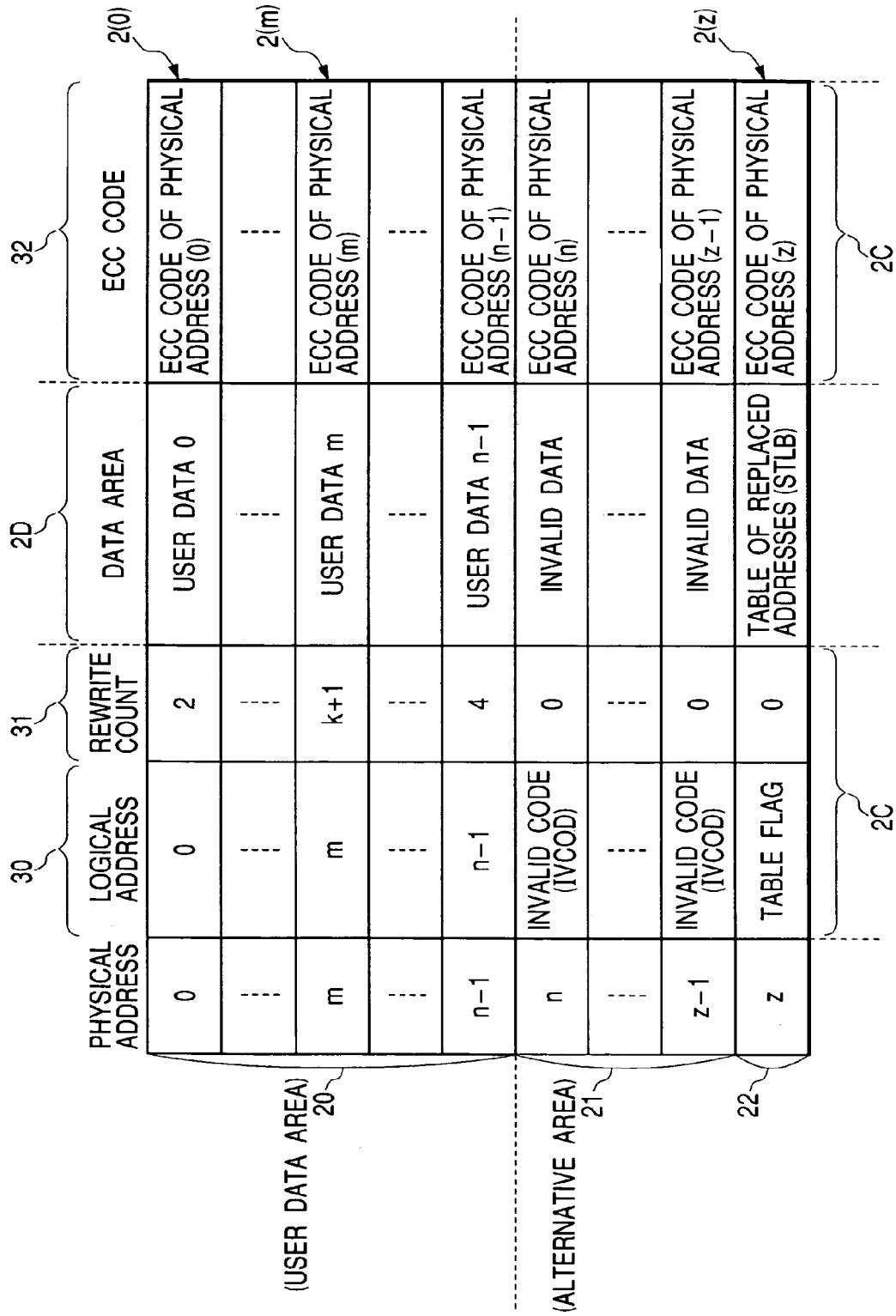
FIG. 2 illustrates an example of data block-based data structure in a flash memory.

[Data structure of flash memory] FIG. 2 illustrates an example of data block-based data structure in the flash memory 3. In FIG. 2, there are, for instance data blocks 2(0) through 2(z) having physical addresses 0 through z, respectively, and the data-blocks 2(0) through 2(n−1) of the physical addresses 0 through n−1, respectively, constitute a user data area 20, the data blocks 2(n) through 2(z−1) of the physical addresses n through z−1, respectively, an alternative area 21, and the data block 2(z) of the physical address z, a replaced address table formation area 22. A physical address is allocated to each of the data blocks 2 as stated above, and the data block 2 has, as the management areas 2C, a logical address area 30, a rewrite count area 31 and an ECC code area 32.

The logical address area 30 is supposed to be an address information holding area usable for holding information on logical addresses which are matched to physical addresses. The rewrite count area 31 holds the rewrite counts of the corresponding data block 2. The ECC code area 32 holds an ECC code or codes as error check information on the corresponding data block 2. An ECC code may cover a whole data block or only a particular data area. Into parts of the logical address area 30 which are not used for the allocation of logical addresses, an invalid code IVCOD is initially written by the controller 5. Thus the other parts of the logical address area 30 than the physical address z in the alternative area 21 initially has the invalid code IVCOD. A table flag is stored in the logical address area 30 in the data block 2(z) of the physical address z, and in the data area of that data block 2(z) is stored a table of replaced addresses STLB.

The controller 5 searches for a data block 2 according to the logical address as the physical address and, if the physical address of the retrieved data block 2 and the information held in the logical address area 30 of that data block are found identical, the data block will be judged as not being replaced. Therefore, the table of replaced addresses STLB needs to be referenced to find the replaced address only when the physical address of the retrieved data block and the information held in the logical address area 30 of that data block are found not identical. Thus, the table of replaced addresses STLB need not be referenced on every occasion of access processing.

Regarding this embodiment of the invention, a formula according to which the table of replaced addresses STLB is referenced every time will be described. However, since the invention permits minimization of the alternative area, it is also possible to directly search the alternative area instead of referencing the table STLB.

Figure 3:
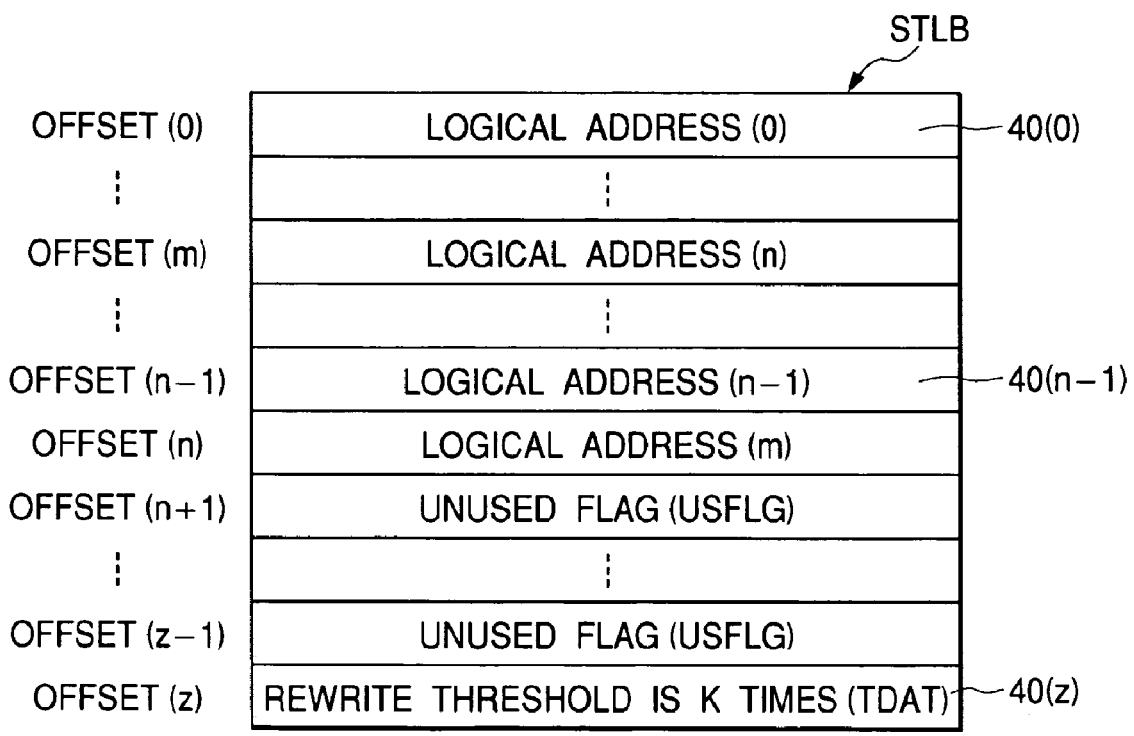
FIG. 3 illustrates an example of table of replaced addresses.

FIG. 3 illustrates an example of table of replaced addresses STLB. The table of replaced addresses STLB is a data table for use in checking any data block in the alternative area 21 to replace a data block 2 which is either defective or has run out of its rewritable life in the user data area 20. This table of replaced addresses STLB has table information holding areas 40, i.e. 40(0) through 40(z) according to the order in which physical addresses are arrayed. The table information holding areas 40(0) through 40(z) are used to hold corresponding logical address information according to the order in which physical addresses are arrayed. The physical address corresponding to any of the table information holding areas 40(0) through 40(z) is obtained from the offset of the pertinent table information holding area. For instance, the logical address (n−1) corresponding to the physical address (n−1) is obtained from the table information holding area 40(n−1) positioned at the offset (n−1) of the table of replaced addresses STLB. This table of replaced addresses STLB can indicate which physical address the current logical address is allocated to and where an unused area is.

The controller 5, if it finds inconsistency between the physical address of the data block retrieved according to the logical address as the physical address and information held in the logical address area 30 of the pertinent data block, can reference the table information holding areas 40 corresponding to the physical address of the table of replaced addresses STLB and find out which data block the logical address is replaced by. For instance with reference to FIG. 3, the logical address corresponding to the physical address (n) is the logical address (m) on the basis of the table information holding area 40(n) positioned at the offset (n) of the table of replaced addresses STLB.

To determine a new available alternative, in the table information holding areas 40(0) through 40(z−1) of the table of replaced addresses STLB is stored, as an unused code, an unused flag USFLG corresponding to a data block to which no logical address is allocated. The controller 5, when replacing a data block, references the table of replaced addresses STLB, and determines a data block corresponding to the unused flag USFLG as a new available alternative.

The table information holding area 40(z) at the offset (z) of the table of replaced addresses STLB is used as a storage area 40(z) for rewrite threshold count data TDAT. The controller 5 uses the rewrite threshold count data TDAT for determining whether or not a data block is to be replaced or assessing its remaining rewritable life. Since the rewritable life of a data block fluctuates from one semiconductor manufacturing process to another, this arrangement is made to enable the remaining rewritable life to be assessed.

[Replacement control in read operation] Next will be described replacement control in an operation to read out of a data block.

Figure 4:
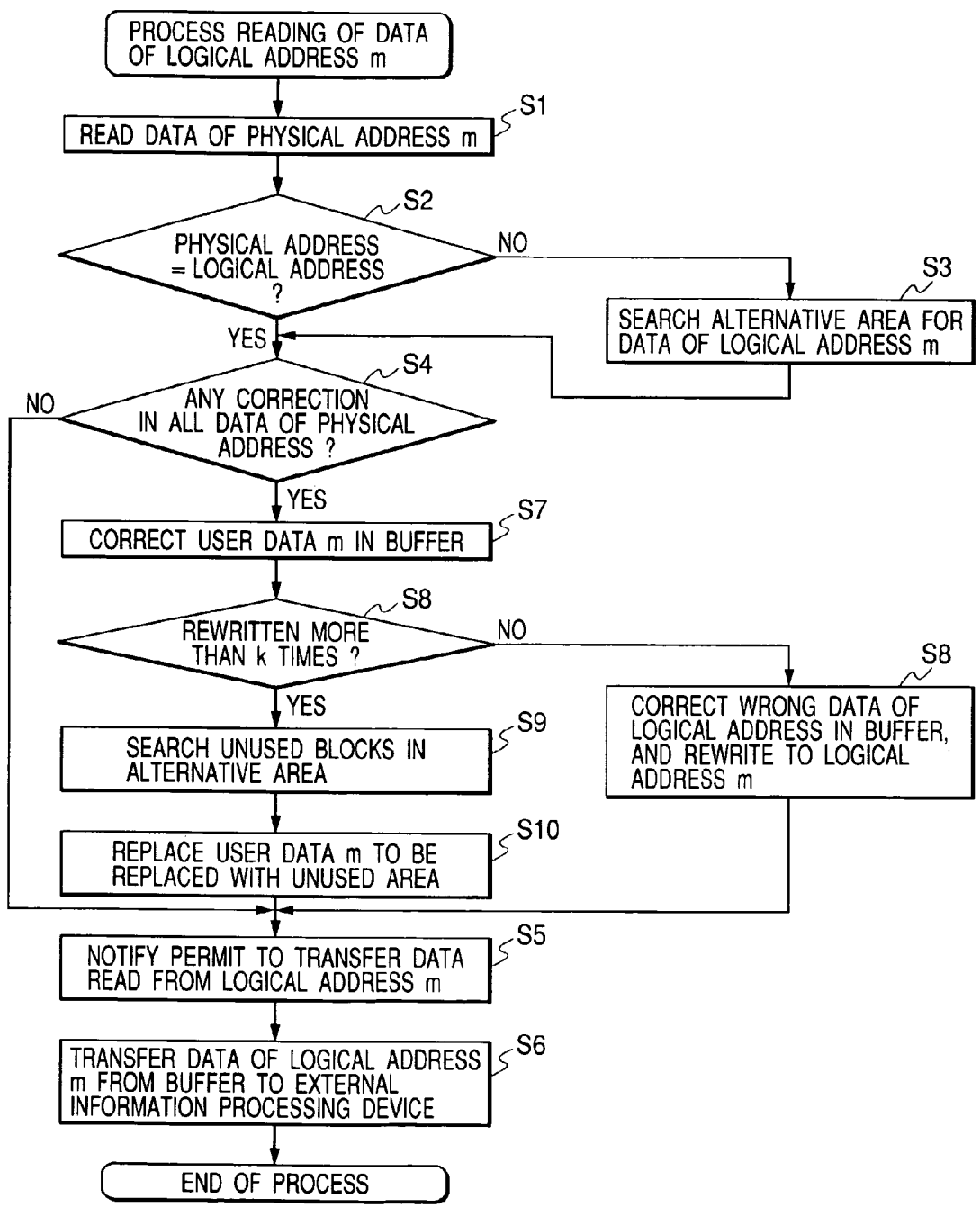
FIG. 4 is a flow chart showing an example of control flow of read operation by a controller.

FIG. 4 shows an example of control flow of read operation by the controller. When processing to read data at the logical address m is instructed, the data block at the physical address m is read out to the buffer 13 in response (S1). It is determined whether or not the logical address information held in the logical address area 30 of the read data block 2(m) is identical with the physical address of the data block 2(m) (S2). If it is, it will be determined that the data block has not been replaced. If it is not, it will be determined that the data block has been replaced, the table of replaced addresses STLB will be referenced to search the alternative area 21 for the data block of the logical address m, and the information stored in that data block will be read out to the buffer 13 (S3). The presence or absence of any error in all the data in the data block pertaining to the judgment of identity at step S2 or the alternative data block searched for at step S3 is judged by the ECC circuit (S4). According to the present invention, user data are managed using a logical address code. However, the invention can be realized in some other way, for instance the physical address and the logical address are deemed to be identical when the check at S2 shows the ECC code to be uncorrected or correctable, or when it is not correctable the data block is deemed to have been replaced, the alternative area is searched and the logical address m is referenced. If there is no error, the controller 5 will demand from the external information processing device 4 a permission to transfer user data of the logical address m (S5) and, when the permission comes from the external information processing device 4, transfer the data of the logical address m from the buffer 13 to the external information processing device 4 (S6).

If an error is determined at step S4, the read data will be corrected in the buffer 13 (S7). Then it is judged whether or not the rewrite count is above the level indicated by the rewrite threshold count data TDAT (e.g. K times) (S8). If it is not more than K times, the data of the logical address m in the buffer 13 will be corrected, and the corrected data written back into the data block of the physical address corresponding to the pertinent logical address m to correct the corresponding stored data in the flash memory 3. After that, the process goes ahead to steps S5 and S6 to transfer data to the external information processing device 4.

If it is determined at step S8 that the rewrite count is more than K times, the table of replaced addresses STLB will be referenced to search the alternative area 21 for an unused data block (S9). Replacement is processed to use the unused data block that has been retrieved as the new data block of the logical address m (S10). In this replacement processing, first, information of the logical address m is stored into the logical address area of the unused data block that has been retrieved, the user data m are stored into the data area of the unused data block, and physical address information of the unused data block is stored into the logical address area of the data block of the logical address m before the replacement. Second, information of the logical address m is stored in the offset position corresponding to the physical address of the unused data block in the table information holding areas 40 on the table of replaced addresses STLB. After that, the process goes ahead to steps S5 and S6 to transfer data to the external information processing device 4.

Figure 5:
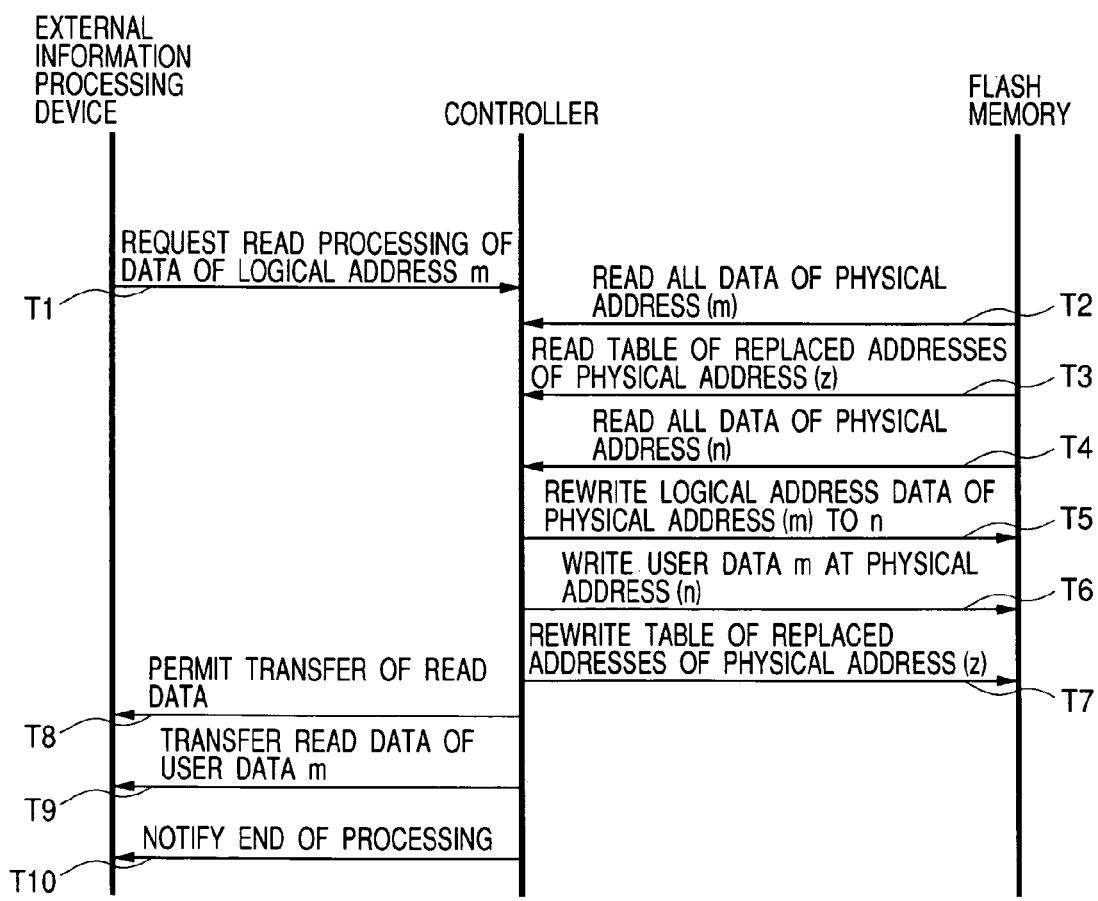
FIG. 5 is a flowchart comprehensively showing an operation to read data out of a flash memory card using the read control of FIG. 4.

FIG. 5 is a flow chart comprehensively showing an operation to read data out of the flash memory card 1 using the read control of FIG. 4. In the operation charted therein, the state of the flash memory 3 before the reading is supposed to be the state shown in FIG. 2, the state of the flash memory 3 after the reading, the state shown in FIG. 6, and the state of the table of replaced addresses STLB after the reading, the state shown in FIG. 3. The rewrite threshold count is supposed to be K times.

The external information processing device 4 demands to read data of a specific data block in the user data area 20 from the controller 5, for instance that of the logical address m (T1). In response, the controller 5 receives from the flash memory 3 data of the data block of the physical address m (T2). the controller 5 subjects the read data that have been received to the processing shown in FIG. 4. In this example it is supposed that, as shown in FIG. 2, the logical address of the logical address area 30 of the data block 2(m) is equal to the physical address m, and that an error correctable with an ECC code has arisen in the data of that data block 2(m). Further, the rewrite count of the data block 2(m) is supposed to be K+1, surpassing the upper limit of K. The controller 5, in order to search for an unused data block in the alternative area 21, reads the table of replaced addresses STLB of the physical address z from the flash memory 3 (T3). The controller 5 searches the table of replaced addresses STLB for a table information holding area having an unused flag (USFLG) and obtains, for instance, the table information holding areas 40(n). On the basis of the offset of this area 40(n), the controller 5 reads out information of the data table of the physical address (n), and confirms that an invalid code IVCOD is stored in that logical address area 30 and that there is no error on the basis of the ECC code in the ECC code area (T4). If no invalid code is stored or there is an error according to the ECC code, the processing of T3 and T4 will be repeated.

If the presence of the invalid code and the absence of any error according to the ECC code are confirmed by the processing of T4, the logical address area of the data block of the logical address m before the replacement will be replaced with address information n (T5), information of the logical address m stored into the logical address area of the data block of the physical address n, user data m written into that data area (T6), and the table of replaced addresses STLB so rewritten as to store information of the logical address m in the offset position corresponding to the physical address n (T7).

After that, the controller 5 demands a permission to transfer read data from the external information processing device 4 (T8) and, when the permission comes from the external information processing device 4, transfers the data of the logical address m (user data m) to the external information processing device 4 (T9). After the transfer, the controller 5 notifies the external information processing device 4 of the end of read processing (T10).

In the above-described replacement control in read operation, the capability of a nonvolatile memory with a good history to perform further rewriting even if the predetermined rewrite count threshold has been reached is taken note of. As indicators of that capability, the result of ECC error check on data in the data block and the rewrite count are taken into consideration. If there is any error in the data read out of the data block and the rewrite count has not reached the predetermined threshold, correction by ECC or otherwise will be performed. Usually in a nonvolatile memory, such as a flash memory, within the guaranteed rewrite count threshold, if it has an error correcting capability (the number of error-correctable bits) recommended or required by the manufacturer of the memory, no uncorrectable situation will occur. Therefore, no problem in the reliability of data is likely to occur even if data whose error has been corrected by ECC or otherwise are returned to the pertinent data block. On the other hand, if there is any data error and the rewrite count has surpassed the predetermined threshold, an error of a bit number beyond the error correcting capability of ECC is likely to occur. Therefore the data block will be replaced and the new replacing data block will be caused to hold the corrected data for subsequent use.

Therefore, by the above-described replacing technique in combination with ECC, even if the rewrite count surpasses the limit of guarantee, the average rewrite count per data block address can be increased eventually, compared with the technique by which replacement is performed merely on the basis of a predetermined rewrite count limit. This makes it possible to dispense with an excessive alternative area.

Furthermore, it is made possible to avoid keeping a data block already deteriorated in performance in a rewritable state as in the case of replacing the data block merely according to the number of errors that have occurred on the basis of ECC, and the reliability of information storage can be thereby enhanced.

[Replacement control in rewrite operation] Next will be described replacement control on the data block in rewrite operation.

Figure 7:
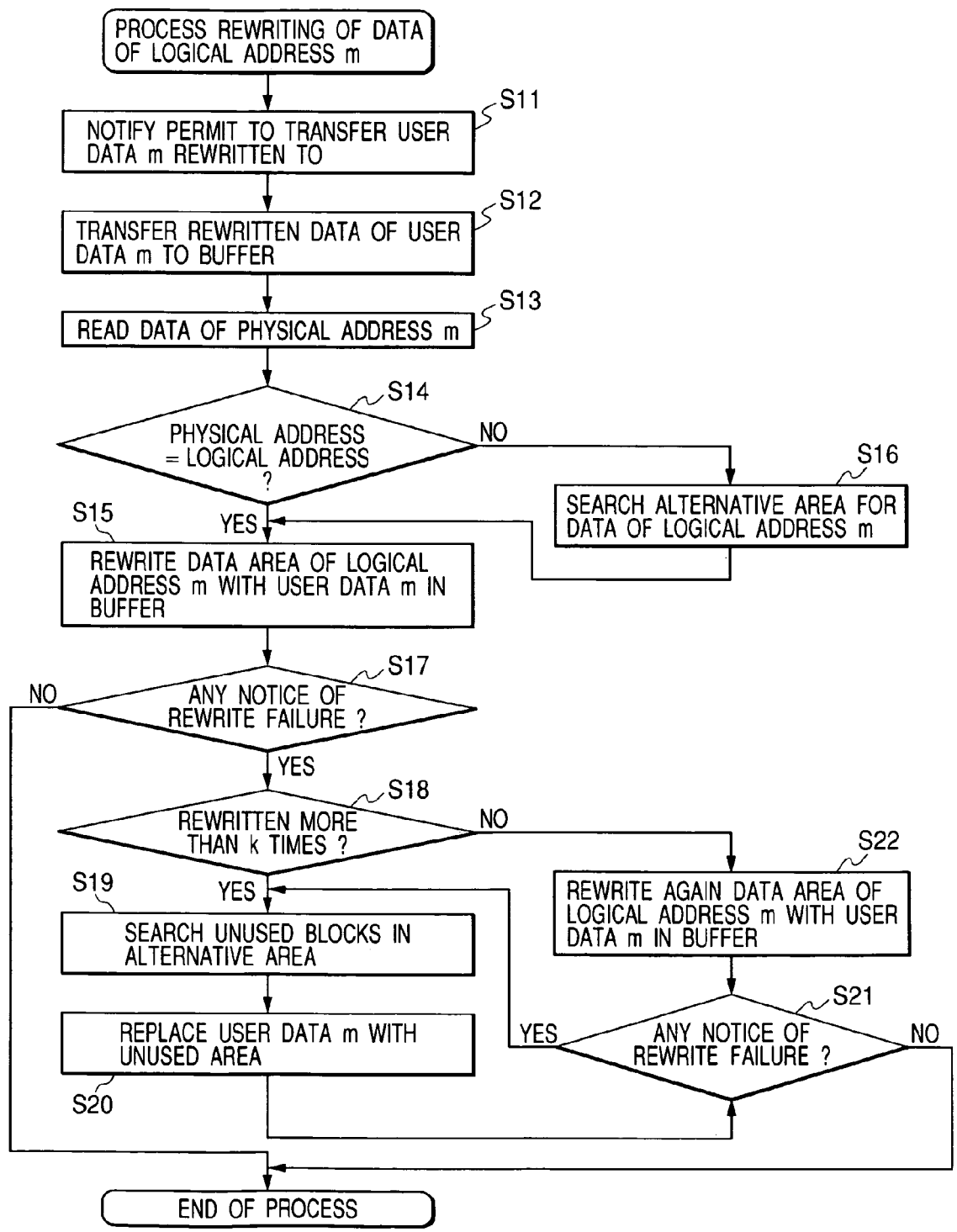
FIG. 7 is a flow chart showing an example of control flow of write operation by the controller.

FIG. 7 is a flow chart showing an example of control flow of write operation by the controller. When an instruction is given to rewrite data of the logical address m, in response the controller 5 notifies the external information processing device 4 of a permission to transfer rewrite data for the logical address m (rewrite data for user data m) (S11). Receiving this permission, the controller 5 accepts the rewrite data supplied by the external information processing device 4, and stores the data into the buffer 13 (S12). The controller 5 reads the data block of the physical address m to the buffer 13 (S13). It is then judged whether or not logical address information held in the logical address area 30 of the data block 2(m) that has been read out and the physical address of the data block 2(m) are identical with each other (S14). If they are, it will be determined that the data block has not been replaced, and the data area of the physical address m corresponding to the data block 2(m) of the logical address m replaced with data in the buffer 13 (S15). If not, it will be determined that data block replacement has taken place, the table of replaced addresses STLB searched for a data block whose logical address m has been replaced (S16), and the data area in that replaced data block replaced with data in the buffer 13 (S15). In the rewriting at step S15, the controller 5 judges the presence or absence of a notification of rewrite failure from the flash memory 3 (S17). If there is no failure, that rewrite processing will be ended. If there is a failure, the controller 5 judges whether or not the rewrite count at the time is greater than the count indicated by the rewrite threshold count data TDAT (e.g. K times) (S18).

If the judgment at step S18 indicates a greater rewrite count than K times, the table of replaced addresses STLB will be referenced to search the alternative area 21 for an unused data block (S19). Processing is done to substitute the retrieved unused data block as the new data block of the logical address m (S20). In this replacement processing, first, information of the logical address m is stored into the logical address area of the retrieved unused data block, the user data m for rewrite in the buffer 13 into the data area of the unused data block, and physical address information of the unused data block into the logical address area of the data block of the logical address m before the replacement. Second, information of the logical address m is stored in the offset position corresponding to the physical address of an unused data block in the table information holding area 40 of the table of replaced addresses STLB. Regarding the pertinent replacement processing, the controller 5 judges the presence or absence of a notification of rewrite failure from the flash memory 3 (S21), and if there is no failure, that rewrite processing will be ended. If there is a failure, the processing at steps S19 and S20 will be repeated. Regarding the replacement processing at step S20, the number of retrials may be restricted, or a restriction imposed according to the rewrite count, and when the limit is reached, the process is deemed to have ended erroneously.

If the judgment at step S18 indicates that the rewrite count is not greater than K times, the controller 5 will perform processing again to replace the data area of the logical address m with the user data m for rewrite in the buffer 13 (S22). The presence or absence of a notification of rewrite failure is also judged for this writing at step S21 and, if there is a failure, the processing at steps S19 and S20 will be carried out.

Figure 8:
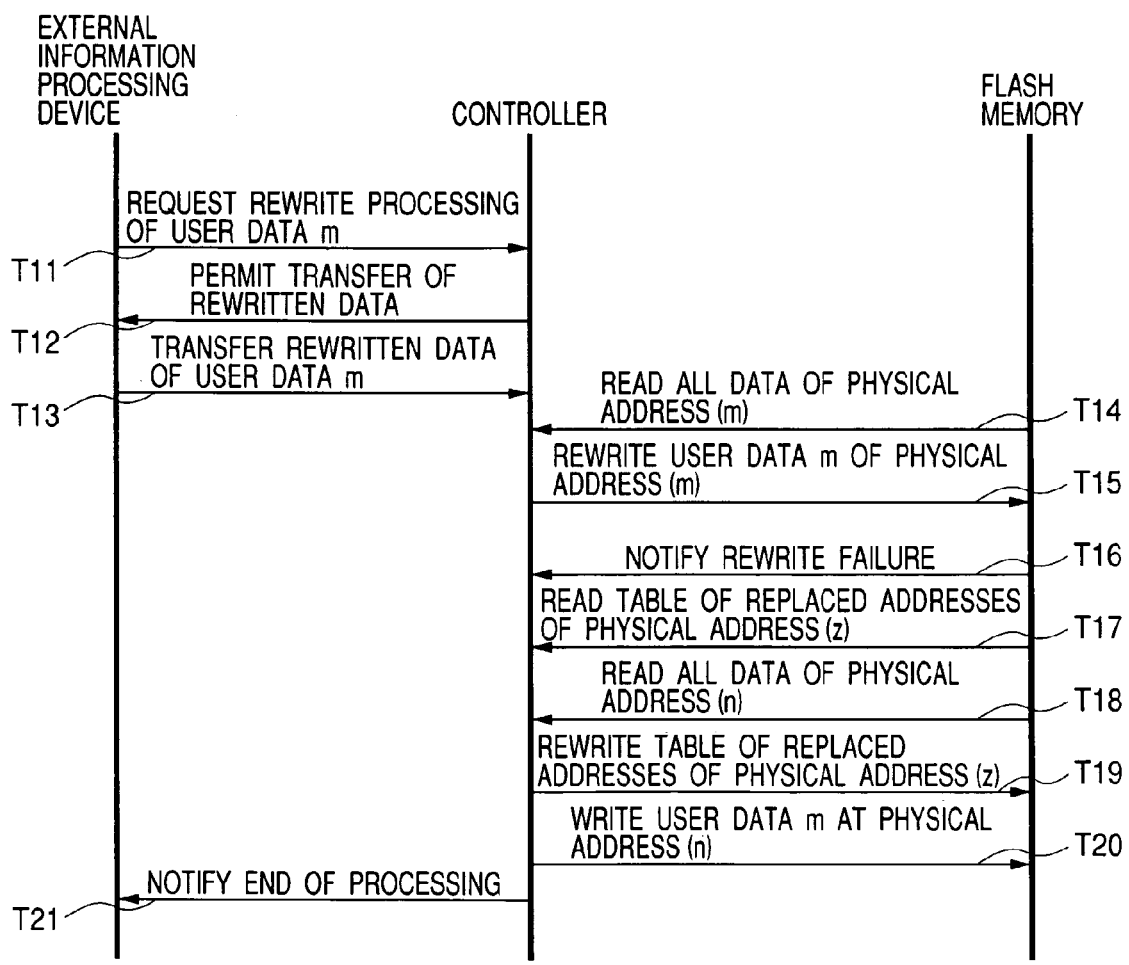
FIG. 8 is a flow chart showing an example of operation in the event of failure of rewriting of data in the flash memory in response to a rewrite request from an external information processing device.

FIG. 8 is a flow chart showing an example of operation in the event of failure of rewriting of data in the flash memory in response to a rewrite request. In the rewriting charted therein, the state of the flash memory 3 before the writing is supposed to be the state shown in FIG. 2, and the state of the flash memory 3 after the writing, the state shown in FIG. 9. The rewrite threshold count is supposed to be K times.

There take place data rewrite processing from the external information processing device 4 to the logical address m (T11), the notification of permission, in response to that, to transfer rewrite data (rewrite data for the user data m) from the controller 5 to the external information processing device 4 (T12), and the processing to transfer the rewrite data for the user data m from the external information processing device 4 to the controller 5 (T13). The controller 5 reads the data block of the physical address m out of the flash memory 3 (T14), confirms that the data block of the logical address m has not been replaced, and replaces the data block of the pertinent physical address m with the rewrite data for the user data m (T15). Then, for instance the flash memory 3 issues a notification of rewrite failure to the controller 5 (T16). Since the rewrite count is beyond its upper limit K, the table of replaced addresses STLB of the data block 2(z) is read out of the flash memory 3 in order to replace data block (T17). The controller 5 searches the table of replaced addresses STLB, perceives the data block of the address n as what is to be replaced, and this time reads the data block of the pertinent physical address n out of the flash memory 3 (T18). The data block of the physical address n that has been read out is subjected to error detection of the like and, if it is found normal, in order to use the data block of this physical address n for replacement, the controller 5 will rewrite the table of replaced addresses STLB as described to have that replacement reflected (T19), and replace the data block of the physical address n with the rewrite data for the user data m (T20). Finally, the controller 5 notifies the external information processing device 4 of the end of processing (T21).

Figure 6:
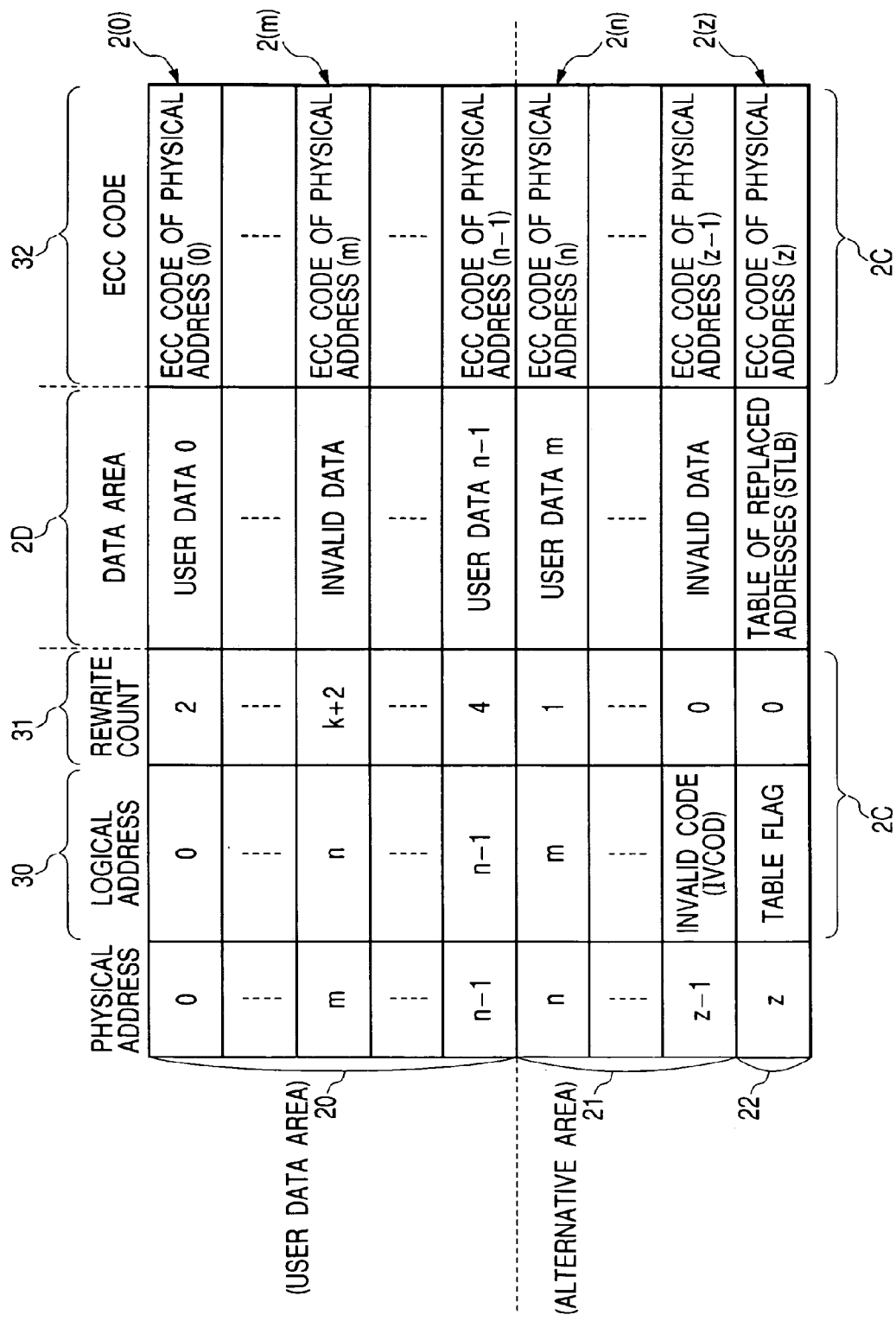
FIG. 6 illustrates an example of variation in data structure that takes place in the flash memory of FIG. 2 when data are read out of the flash memory card.
Figure 9:
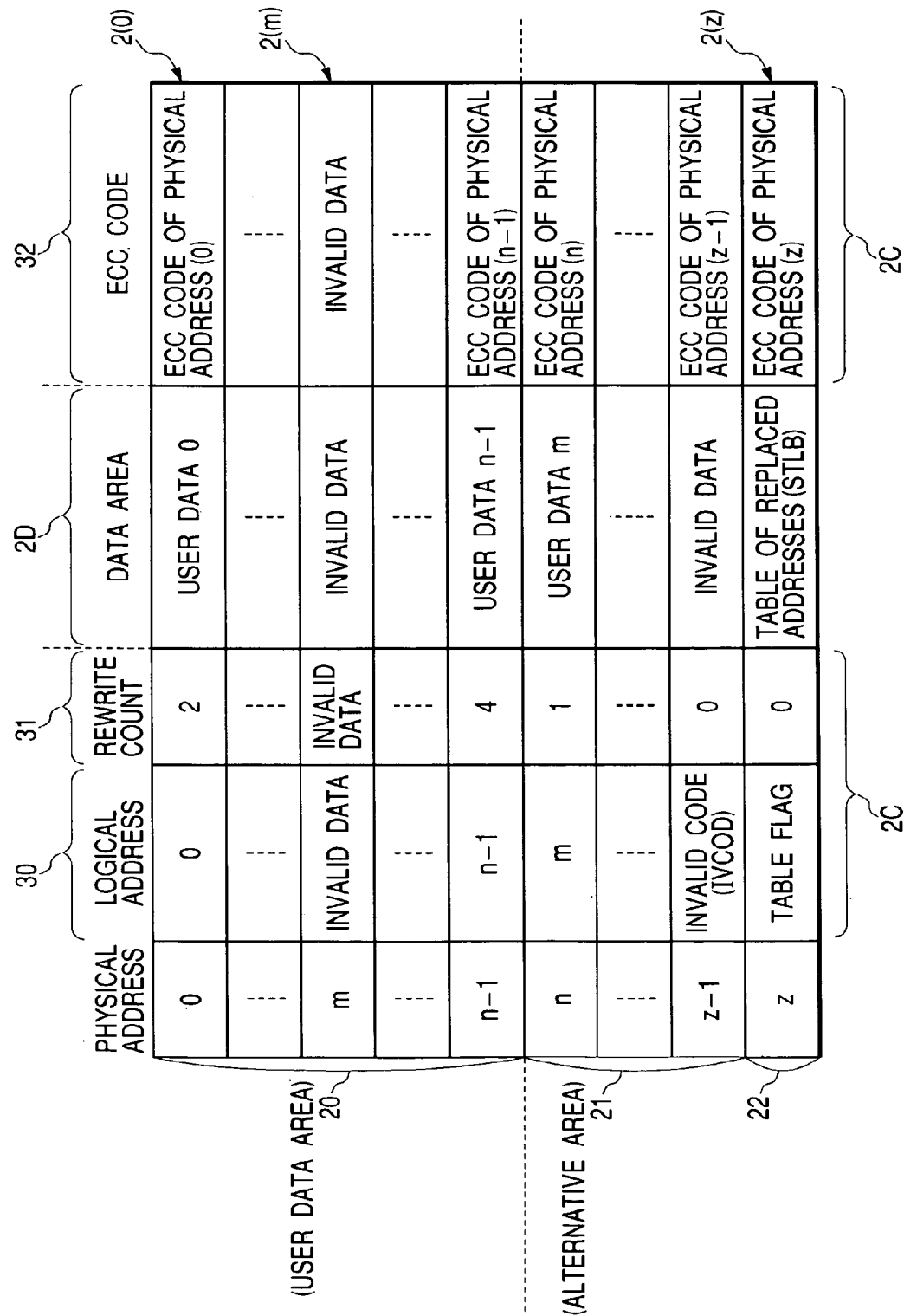
FIG. 9 illustrates the result of rewrite processing by the operation shown in FIG. 8.

In FIG. 9 illustrating the result of rewrite processing by the operation shown in FIG. 8, because the rewriting of the physical address m in the flash memory whose initial state is shown in FIG. 2 has failed unlike in the state shown in FIG. 6, all the data are invalidated. Invalidity in this context means that, for instance, all the data have been erased or are incapable of being corrected by ECC.

In the read operation, in the event of an ECC error, the rewrite count is referenced and, if its upper limit is surpassed, the data block will be replaced. In the case of rewriting, if a rewrite attempt fails, the rewrite count will be referenced and, if its upper limit is surpassed, the data block will be replaced. This is because the probability of rewrite failure presumably increases with the deterioration of memory cell performance and, if the rewrite count has surpassed its upper limit when a rewrite attempt has failed, the rewritable life of the memory cell is likely to be near its end. This is similar to the presumption in the read operation that, when an ECC error has occurred and the rewrite count is beyond its upper limit, the rewritable life of the memory cell is near its end. Therefore, in the case of rewriting as in reading, the combination with ECC permits replacement even if the rewrite count has surpassed the guaranteed limit, makes it possible to dispense with an excessively large alternative area and, furthermore, can prevent a much deteriorated data block from being left in a rewritable state unlike in the case wherein the number of errors according to ECC is made the sole yardstick of data block replacement, resulting in enhanced reliability of information storage. As the controller selects a data block according to its logical address as the physical address, the table need not be referenced on every occasion of access processing, making it possible to ensure high speed access and extend the rewritable life.

[Another way of replacement control in rewrite operation]
Next will be described another example of replacement control in rewriting into the data block.

Figure 10:
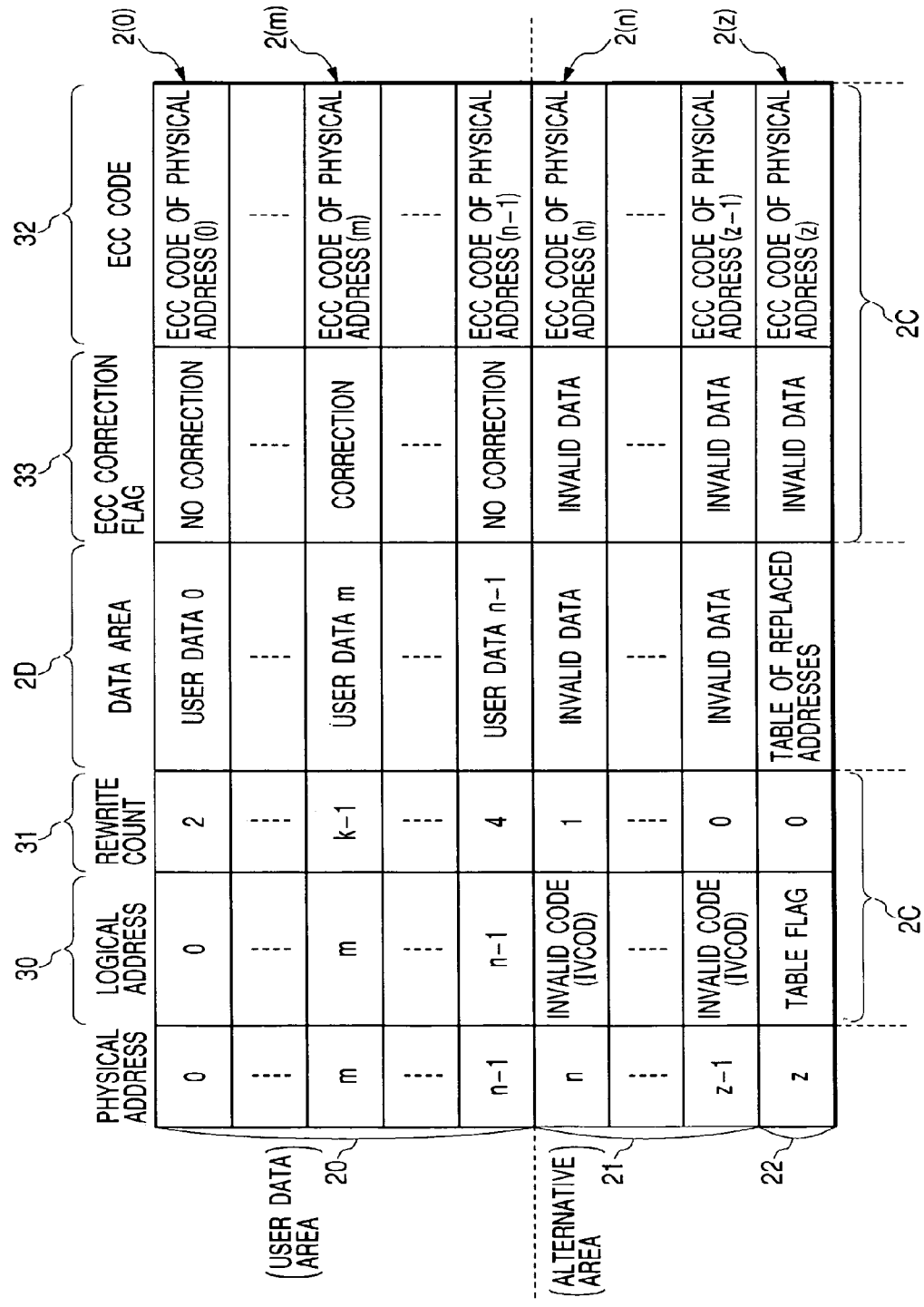
FIG. 10 illustrates an example of a data structure of a flash memory 3 having an ECC correction flag area.

FIG. 10 illustrates another example of data structure of the flash memory 3. The difference from the data structure of FIG. 2 is that an ECC correction flag area 33 is added to each of the data blocks 2. In the ECC correction flag area 33, when the corresponding data block is read, if it is found having undergone ECC correction at least once, a correction flag will be erected. If there has been no correction, a correction-free flag will be erected. In the alternative area 21, the ECC correction flag area 33 before replacement contains invalid data, i.e. is in an erased state. In the example of FIG. 10, the physical address m indicates the past occurrence of a correction by ECC.

Figure 11:
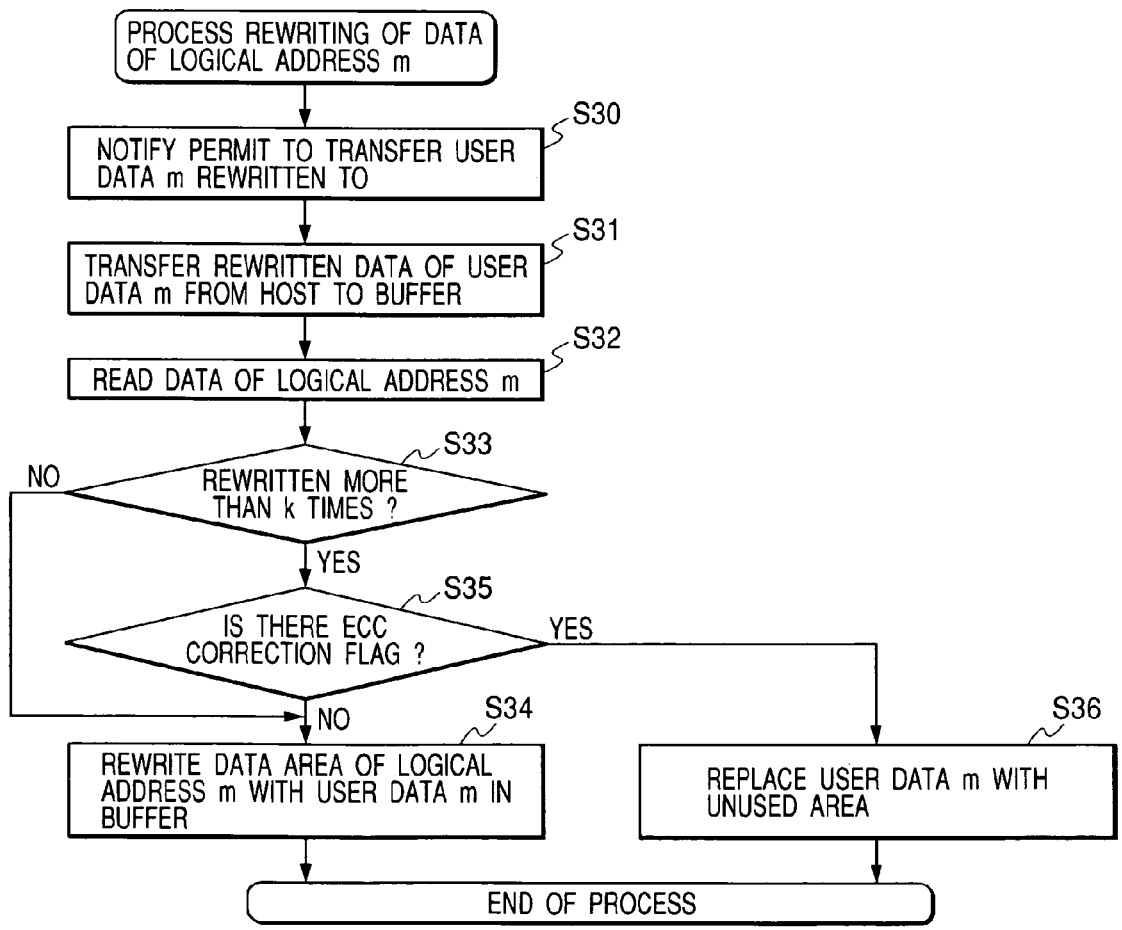
FIG. 11 is a flow chart showing an example of control flow of rewrite operation by the controller referencing the ECC correction flag area.

FIG. 11 is a flow chart showing an example of control flow of rewrite operation by the controller on the data structure shown in FIG. 10. When rewriting of data of the logical address m is instructed, in response the controller 5 notifies the external information processing device 4 of a permission to transfer rewrite data (the rewrite data for the user data m) to the logical address m (S30). Receiving this permission, the controller 5 accepts the rewrite data supplied from the external information processing device 4 and stores them into the buffer 13 (S31). The controller 5 reads out the data block of the logical address m (S32), and judges whether or not the rewrite count of the pertinent data block is beyond the upper limit K (S33). If the count has not reached K, the data area of the data block of the logical address m will be replaced with the rewrite data for the user data m held by the buffer 13 (S34). If the rewrite count is K or greater, it is judged whether or not the ECC correction flag is erected in the data block of that logical address m (S35). If the ECC correction flag is not erected, rewrite processing of step S34 will be performed. If the ECC correction flag is erected, the data block of that logical address m will be replaced with an unused data block, and the rewrite data for the user data m written into the replaced address (S36).

Though not illustrated, if a write error occurs at step S34, processing of step S36 can follow. Though not shown either, it is also possible to perform processing after a rewrite failure in FIG. 7 and processing according to the presence or absence of the ECC error correction flag in FIG. 11.

Figure 12:
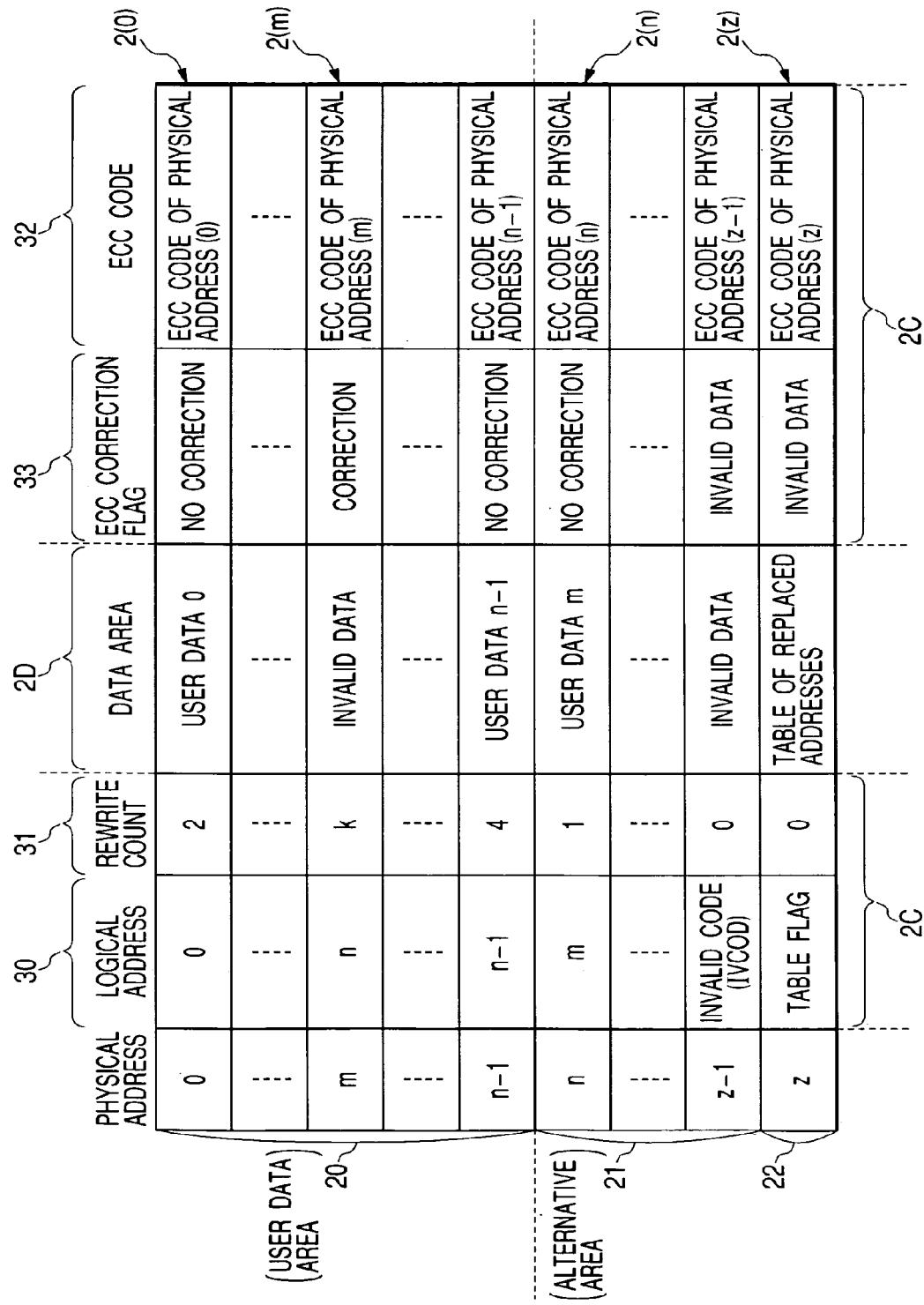
FIG. 12 illustrates an example of data structure of the flash memory after replacement processing shown in FIG. 11 on the flash memory of the data structure of FIG. 10.

FIG. 12 illustrates an example of data structure of the flash memory after replacement processing shown in FIG. 11 on the flash memory 3 of the data structure of FIG. 10. The user data m stored in the data area 2D of the physical address m is replaced by the physical address n.

In the case of rewriting illustrated in FIG. 11, if the rewrite count is beyond its upper limit and has undergone ECC correction at least once, the data block will be replaced for rewriting. This is similar to the presumption in the read operation that, when an ECC error has occurred and the rewrite count is beyond its upper limit, the rewritable life of the memory cell is near its end. Therefore, in the case of rewriting of FIG. 11 as in reading, the combination with ECC permits replacement even if the rewrite count has surpassed the guaranteed limit, makes it possible to dispense with an excessively large alternative area and, furthermore, can prevent a much deteriorated data block from being left in a rewritable state unlike in the case wherein the number of errors according to ECC is made the sole yardstick of data block replacement, resulting in enhanced reliability of information storage. As the controller selects a data block according to its logical address as the physical address, the table need not be referenced on every occasion of access processing, making it possible to ensure high speed access and extend the rewritable life.

Figure 13:
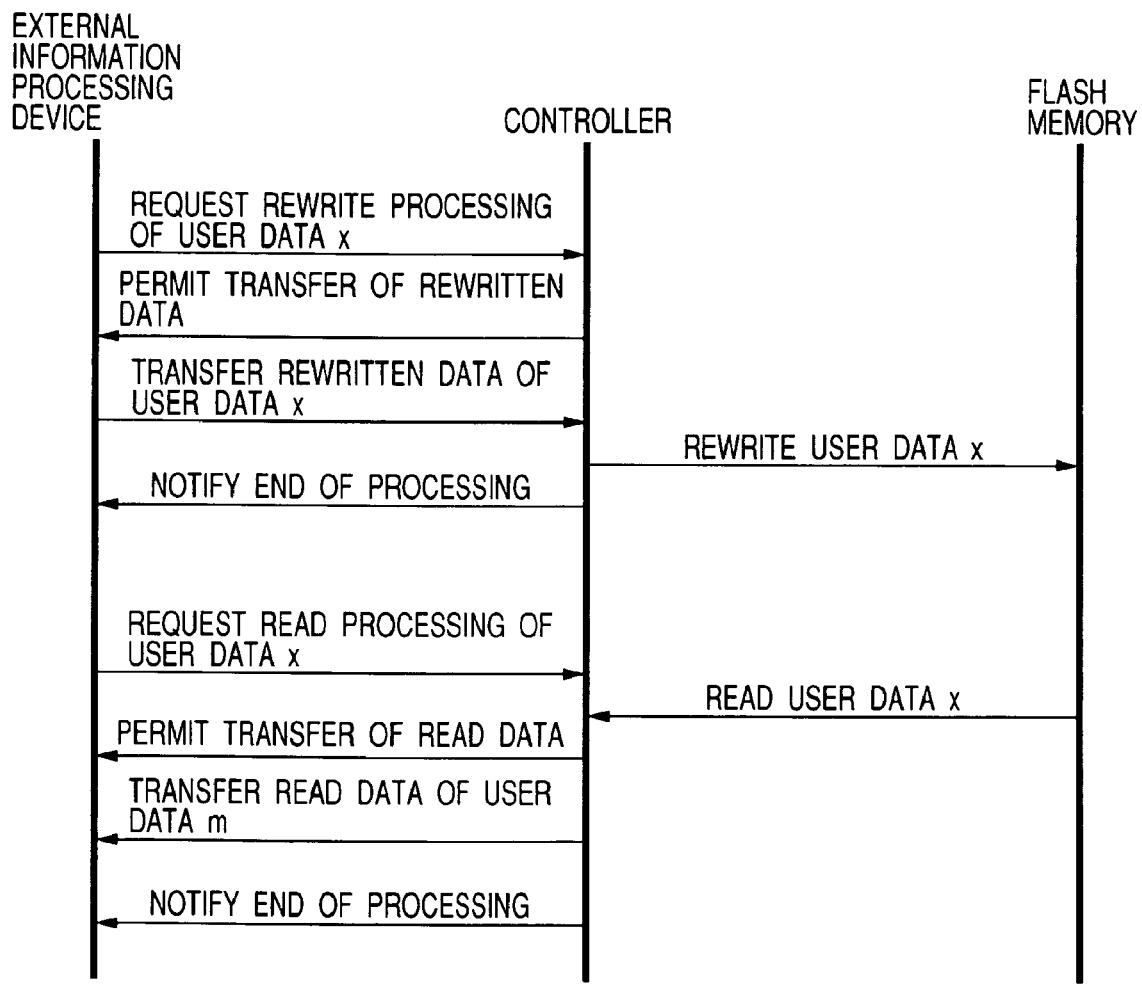
FIG. 13 is a flow chart schematically showing read processing and write processing according to the invention.
Figure 14:
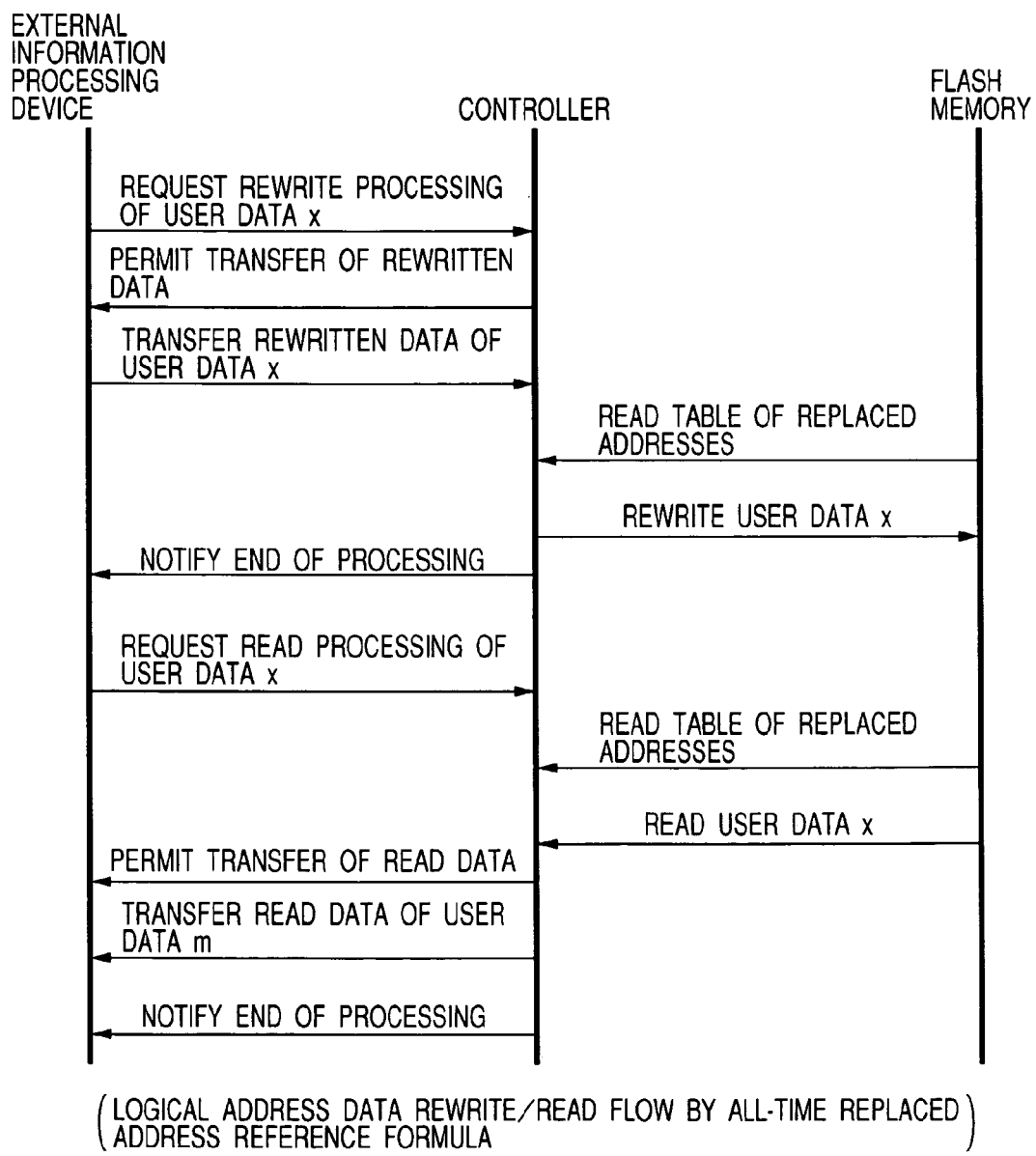
FIG. 14 is a flow chart schematically showing read processing and write processing in a comparative example by an all-time replaced address reference formula.

Finally, the aspect of ensuring high speed access will be explained. FIG. 13 is a flow chart schematically showing read processing and write processing according to the invention described so far. FIG. 14 is a flowchart schematically showing read processing and write processing in a comparative example by an all-time replaced address reference formula, according to which, when a certain rewrite count is reached, data and address replacement is automatically performed with an area in which the rewrite count is smaller and the rewritable life of the nonvolatile memory is thereby extended. In the case of FIG. 14, both in reading and in rewriting, referencing of a replacement table defining the correspondence between logical addresses and physical addresses is indispensable. In this sense, the operation illustrated in FIG. 14 is supposed to be an all-time replaced address reference formula. By contrast, in the case shown in FIG. 13 according to the present invention, since the flash memory is accessed according to the logical address as the physical address, the table of replaced addresses needs to be referenced only when there is any replacement. According to the invention, high speed access is ensured in respect of table reference as well.

Although the invention made by the present inventor has been described in specific terms with reference to an embodiment thereof, obviously the invention is not confined to this embodiment, but can be varied in many different ways without deviating from its essentials.

For example, the nonvolatile memory is not limited to a flash memory. It can as well be an EEPROM, a high dielectric memory or the like. The method of searching the alternative area is not limited to referencing a table, such as the table of replaced addresses STLB. Instead of using such a table, searching can as well be done by directly reading out the logical address area 30 of the alternative area, though the time required for searching would tend to become longer. Having the logical address area of an unused data block in the alternative area hold an invalid code IVCOD is not the only possibility. Simply invalid data or the like may be held therein instead. Further in the data structure of FIG. 10, the condition of erecting a correction flag in the ECC correction flag area 33 is not limited to what was described above. The condition may as well be a predetermined plurality of error corrections by ECC.

Although the foregoing description of the invention made by the present inventor mainly concerned a flash disk or a flash memory card compatible with a hard disk, which was the field of use constituting the background of the invention, the invention can also be applied to many other different memory systems.

Advantages achieved by the invention disclosed in this application in its typical aspects will be briefly described below.

In a memory system, wasteful replacement of usable data blocks to extend the rewritable life can be restrained. In other words, the number of substitutive memory blocks to be made ready to extend the rewritable life can be reduced.

It is made possible to avoid keeping a data block already deteriorated in performance in a rewritable state, and the reliability of information storage can be thereby enhanced.

The table need not be referenced on every occasion of access processing to extend the rewritable life of the memory system, making it possible to ensure high speed access and extend the rewritable life.

What is claimed is:

1. A nonvolatile memory comprising a plurality of data blocks in predetermined physical address units,
    wherein each of said data blocks has areas for holding a rewrite count and error check information regarding each data area, and
    wherein, in a read operation of the nonvolatile memory, the area subject to the read operation is checked for data error by using the error check information and, when any error has occurred, if the rewrite count is greater than a predetermined value, the pertinent data block will be replaced with another data block or, if the rewrite count is not greater, data in the data block pertaining to the error will be corrected.

2. The nonvolatile memory according to claim 1, wherein, in a write operation of the nonvolatile memory, if failure occurs in writing to a data block subject to the write operation, the data block subject to the write operation will be replaced with another data block if the rewrite count is greater than a predetermined value, or will be written to again if the rewrite count is not greater.

3. The nonvolatile memory according to claim 1, wherein, if said attempt to write again fails, the data block will be replaced with still another data block.

4. A nonvolatile memory comprising a plurality of data blocks in predetermined physical address units,
    wherein each of said data blocks has areas for holding a rewrite count and an error correction flag, and
    wherein, in a write operation of the nonvolatile memory, write processing will be performed on a data block subject to the write operation if the rewrite count of the data block is not greater than a predetermined value, the data block will be replaced with another data block if the rewrite count is greater than the predetermined value and the error correction flag indicates that the data block has undergone error correction, or write processing on the data block will be performed again if the rewrite count is greater than the predetermined value and the error correction flag indicates that the data block has undergone no error correction.

5. The nonvolatile memory according to claim 4, wherein if failure occurs in writing on the data block subject to the write operation, the data block will be replaced with another data block if the rewrite count is greater than the predetermined value, or be subjected to write processing again if the rewrite count is not greater.

6. The nonvolatile memory according to claim 5, wherein said error correction flag is flag information of one bit or more indicating whether or not error correction has been done.

* * * * *